US008977915B2

(12) United States Patent
Damodaran et al.

(10) Patent No.: US 8,977,915 B2
(45) Date of Patent: Mar. 10, 2015

(54) PBIST ENGINE WITH REDUCED SRAM TESTING BUS WIDTH

(71) Applicant: Texas Instruments Incorporated, Dallas, TX (US)

(72) Inventors: Raguram Damodaran, Plano, TX (US); Naveen Bhoria, Plano, TX (US); Aman Kokrady, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 13/709,247

(22) Filed: Dec. 10, 2012

(65) Prior Publication Data

US 2014/0164856 A1 Jun. 12, 2014

(51) Int. Cl.
- *G11C 29/22* (2006.01)
- *G11C 29/16* (2006.01)
- *G11C 29/54* (2006.01)
- *G11C 11/41* (2006.01)
- *G11C 29/04* (2006.01)

(52) U.S. Cl.
CPC .............. *G11C 29/16* (2013.01); *G11C 11/41* (2013.01); *G11C 2029/0401* (2013.01)

USPC .......................................... 714/718; 714/733

(58) Field of Classification Search
CPC ........ G11C 29/56; G11C 29/48; G11C 29/16; G11C 29/40; G01R 31/3187; G06F 11/2294; G11B 2220/20
See application file for complete search history.

(56) References Cited

U.S. PATENT DOCUMENTS

| 4,475,172 | A  | * | 10/1984 | Frederiksen ................... 345/440 |
| 5,163,122 | A  | * | 11/1992 | Urabe et al. .................... 358/1.9 |
| 6,874,050 | B2 | * | 3/2005  | Tangen ........................ 710/300 |
| 7,302,625 | B1 | * | 11/2007 | Payakapan et al. ........... 714/733 |
| 2005/0172180 | A1 | * | 8/2005  | Damodaran et al. .......... 714/723 |
| 2009/0063917 | A1 | * | 3/2009  | Tokunaga et al. ............. 714/719 |

* cited by examiner

*Primary Examiner* — April Y Blair
*Assistant Examiner* — Dipakkumar Gandhi
(74) *Attorney, Agent, or Firm* — Robert D. Marshall, Jr.; Frederick J. Telecky, Jr.

(57) ABSTRACT

A programmable Built In Self Test (pBIST) system used to test embedded memories where the memories under test are incorporated in a plurality of sub chips not integrated with the pBIST module. Test data comparison is performed in a distributed data logging architecture to minimize the number of interconnections between the distributed data loggers and the pBIST.

4 Claims, 4 Drawing Sheets

PBIST ENGINE WITH REDUCED SRAM TESTING BUS WIDTH

TECHNICAL FIELD OF THE INVENTION

The technical field of this invention is high speed memory testing, and more particularly a built-in self-test (BIST) system for embedded memories.

BACKGROUND OF THE INVENTION

Testing fabricated integrated circuits to determine proper operation has always been a challenging task, particularly with regard to on-board memory functions. There are two major types of device malfunctions caused by design defects. A design defect arises when the integrated circuit was manufactured to a design specification that did not provide proper function for the intended use purpose. Such a defect affects any manufactured integrated circuit until the design defect is corrected. The integrated circuit manufacturer must detect and correct such defects before shipping large number of devices to customers to avoid a costly recall. In contrast to a design defect, a manufacturing defect involves some fault in the manufacture of the integrated circuit. A manufacturing defect will generally affect less than all parts manufactured. Such defects are corrected by identification and correction of the manufacturing fault.

Most integrated circuit manufacturers test integrated circuits for proper operation before shipment to customers. Increasing integrated circuit complexity makes this testing increasingly difficult. Rather than rely on increasingly expensive external testing devices, many manufacturers test integrated circuits using a built-in self-test (BIST). BIST uses circuits on the integrated circuit designed solely to test the integrated circuit. When triggered either automatically in circuit operation or by an external test device, the BIST circuits produce a set of test conditions run on the ordinary circuit hardware. Comparison of the state of the integrated circuit following test to an expected state indicates whether the integrated circuit passed. An example of such a test is writing to a read/write memory and recalling the data written. A match between the data written and the data read passes the test. BIST typically involves other more complex tests.

A subset of BIST is programmable built-in self test (pBIST) that uses a general purpose test engine programmed by a set of instructions. This set of test instructions is typically stored on the integrated circuit in a read only memory (ROM) and includes instructions particularly developed for that integrated circuit. pBIST enables re-use of hardware and test instructions to cover a family of similar but not identical integrated circuits.

U.S. Pat. No. 7,324,392 entitled ROM-Based Memory Testing includes a description of an exemplary set of instructions for use in a pBIST. This patent is incorporated by reference in its entirety.

In conventional VLSI systems memory testing is done in three steps. In the first step hardwired logic (often available through third-party vendors, examples are memBIST (MBIST) use algorithms developed before the device is committed to tape-out. Determining the detailed make-up of hardwired logic is not feasible at this time. It is impossible to predict the appropriate hardware circuits because the necessary information comes from process model drivers during the process qualification window. Secondly, conventional memory testing attempts to close testing gaps using CPU based techniques. These techniques have a number of limitations. A major limitation is the CPU interface with largely inaccessible memory functions. The inability to do back-to-back accesses to all memories is another severe limitation. Thirdly, during memory testing while the device is in wafer form direct memory access (DMA) external memory accesses cannot be accomplished at full processor speed. This may result in a significant number of failures not being observable.

SUMMARY OF THE INVENTION

An SOC (System On Chip) usually contains a plurality of sub chips performing embedded memory system testing and data logging functions. Communication between the pBIST and the data logger requires a large number of connections that creates difficulties in routing of the connections on the SOC.

This invention describes an embedded memory test system wherein a single pBIST engine is employed that is capable of asynchronously interfacing to a plurality of sub chips with a Distributed Data Logger (DDL) incorporated in each sub chip. The number of required connections between the pBIST and the data loggers is reduced by compression of the test data by the pBIST, and expanding the data by the DDL as required.

BRIEF DESCRIPTION OF THE DRAWINGS

These and other aspects of this invention are illustrated in the drawings, in which.

DETAILED DESCRIPTION OF PREFERRED EMBODIMENTS

SRAM/memory structures of different devices vary by technology, design and implementation. To test memories effectively the address access pattern sequence of the memory testing algorithm should follow a particular pattern that sensitizes and tests the electrical structure within the memory.

In a simple memory structure the physical addresses and logical addresses are contiguous and are matched. Effective testing can be preformed with simple algorithms that linearly increment or decrement addresses. In these memories any possible address scrambling automatically matches the input to the output. Namely bit <0> of the input goes to bit <0> of the output and so on.

Figure 1:
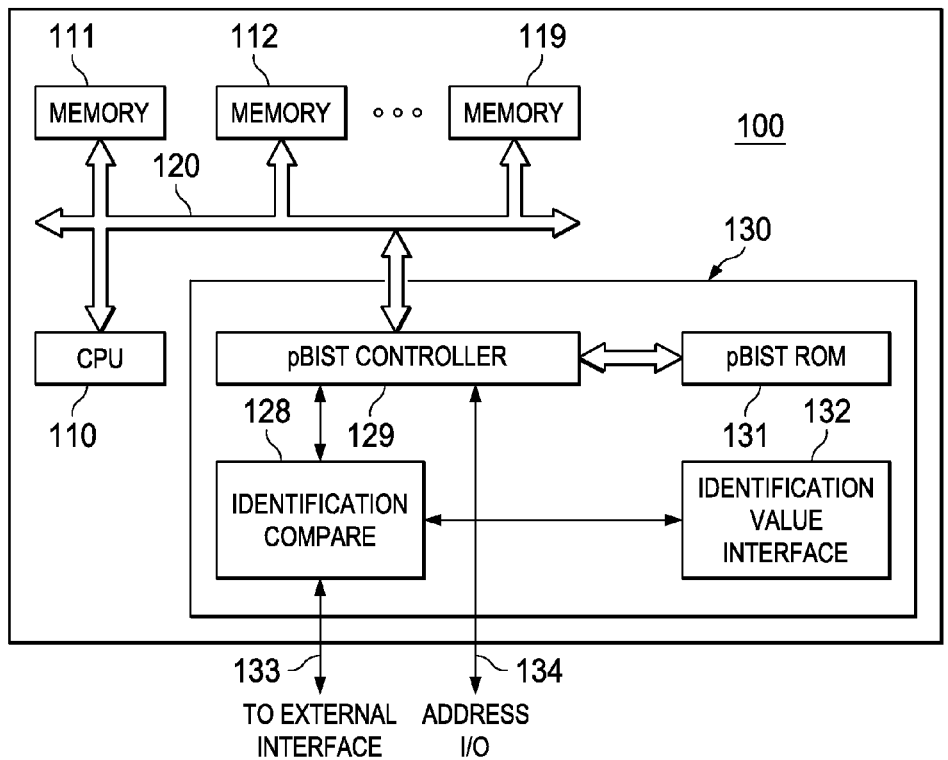
FIG. 1 is a block diagram of a programmable BIST (pBist) unit built into a CPU/memory function of the prior art)

FIG. 1 illustrates a representative prior art 120 integrated circuit (IC), a system-on-chip (SOC) device 100 that includes programmable built-in self-test (pBIST) 130.

The SOC device 100 includes multiple modules that can be highly complex to test. SOC 100 includes central processing unit (CPU) 110 and memories 111 and 112 through 119 coupled by bus 120. Other SOC devices may include multiple processors, complex assemblages of memory and cache subsystems, peripheral devices and interfaces, various types of memory storage such as random access memory (RAM), read only memory (ROM) and possibly various types of alterable memory or flash ROM.

The programmable built-in self-test unit pBIST 130 includes a pBIST controller 129, pBIST ROM 131, an ID Value interface 132, ID Compare unit 128 and external interface 133. pBIST controller 129 controls SOC tests in much the same fashion as CPU 110 controls the normal operation of integrated circuit 100. pBIST unit 130 is controlled by test instructions stored in pBIST ROM 131. pBIST unit 130 may couple to circuits outside integrated circuit 100 via external interface 133. Addresses enter and exit pBist unit 130 via Address I/O 134.

pBIST controller 129 selects a particular pBIST controller within a group of pBIST controllers by using a pBIST ID (identification) value interface 132. The pBIST ID value is typically a five-bit value that allows selection of up to thirty-one pBIST controllers.

Figure 2:
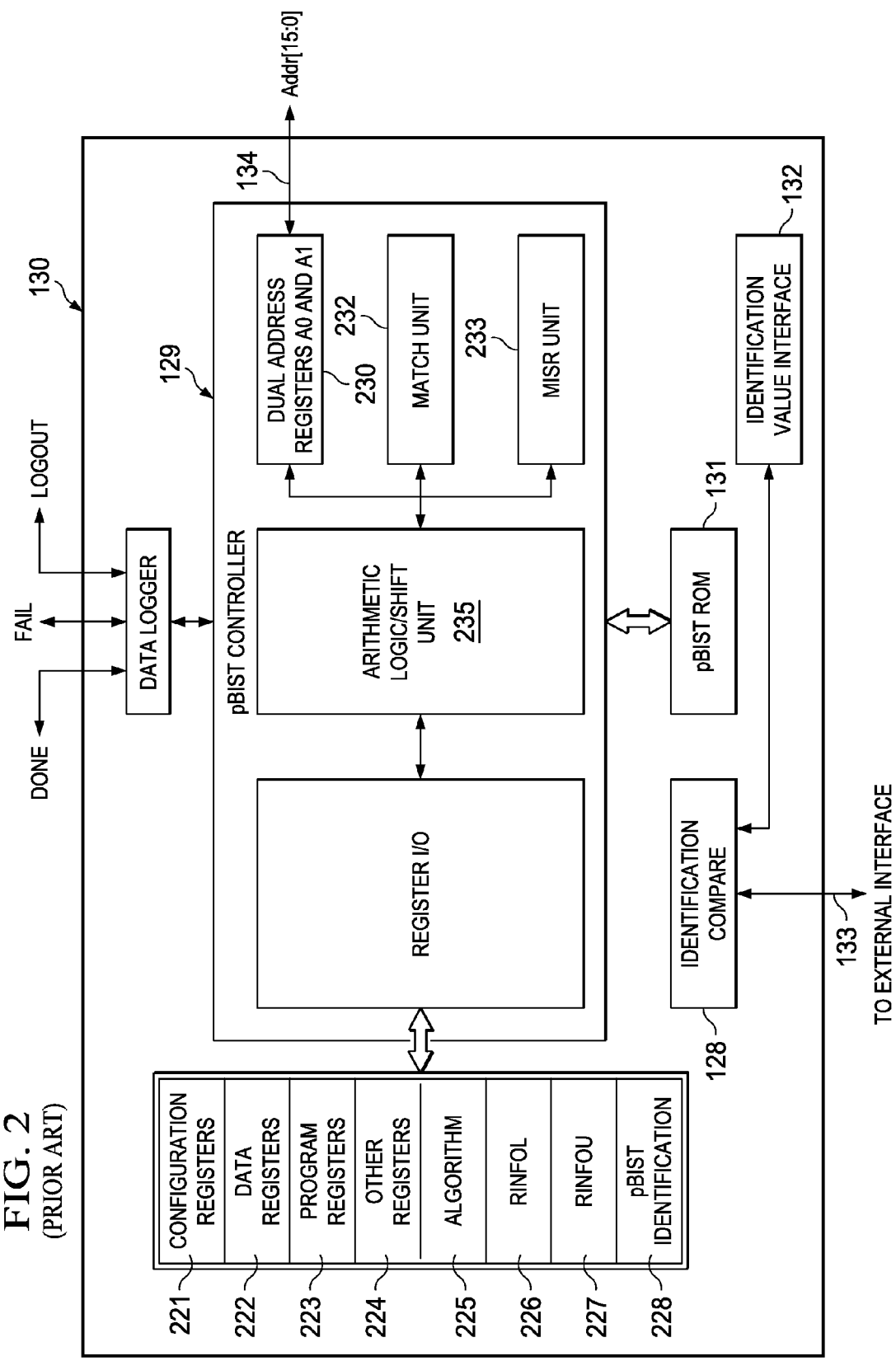
FIG. 2 is a detailed block diagram of a pBist controller of the prior art.

FIG. 2 is a block diagram of functional units included in prior art pBist 130. pBIST unit 130 includes pBIST controller 129, registers 221 through 228, dual address register 230, match unit 232 and multiple input signature register (MISR) unit 233. Addr[15:0] I/O 134 allows for input or output of pBist addresses.

Configuration registers 221 through 228 are memory mapped within the address space of CPU 110. Thus CPU 110 can read from or write to any register 221 through 228 by a memory operation to the corresponding address. Configuration registers 221 through 228 control the configuration and the operational mode of pBIST unit 130. Data registers 222 store test data recalled from pBIST ROM 131. Program registers 223 store test program instructions recalled from pBIST ROM 131. Other registers 224 include miscellaneous general-purpose registers. Configuration registers 221 includes four additional registers algorithm register 225, upper RAM information (RINFOL) register 226, lower RAM information (RINFOU) register 227 and pBIST ID register 228 which will be more fully discussed below.

Algorithm register 225 is actually an algorithm mask register. Bit [0] of this register indicates whether the first algorithm stored in pBIST ROM 131 would be executed. Bit [1] indicates whether the second algorithm is executed and so on. A total of 32 algorithms stored in pBIST ROM 131 can be controlled the 32-bit word width of algorithm register 225. For an algorithm to be executed, both the corresponding bit of algorithm register 225 and a valid bit in the previous algorithm header must be set.

RINFOL register 226 and RINFOU register 227 are group mask registers similar to algorithm register 225. RINFOL register 226 and RINFOU register 227 indicate whether a particular RAM group is tested. This capability is provided because not all algorithms can be run on all memories. For a particular RAM group to be tested the corresponding bit in RINFOL register 226 or RINFOU register 227 and the valid bit in the previous RAM group header must both be set. RINFOL register 226 indicates the validity of RAM groups 0 to 31 and RINFOU register 227 indicates the validity of RAM groups 32 to 63.

pBIST ID register 228 is a memory mapped register that is loaded with a pBIST ID at the beginning of a programming sequence to specify which of a multiple of pBIST controllers 129 is being programmed by an external tester or by the local CPU 110. Upon being reset, pBIST register assumes a value of 0x0000. Each pBIST controller 129 is assigned a unique ID value input via ID value interface 132 when the SOC integrated circuit is designed. This may be embodied by simply tying off the five-bit field to either a high or to a low reference voltage to form a five-bit ID value. Dual Address registers 230 are used in accessing memory, such as memories 111, 112, through 119.

Figure 3:
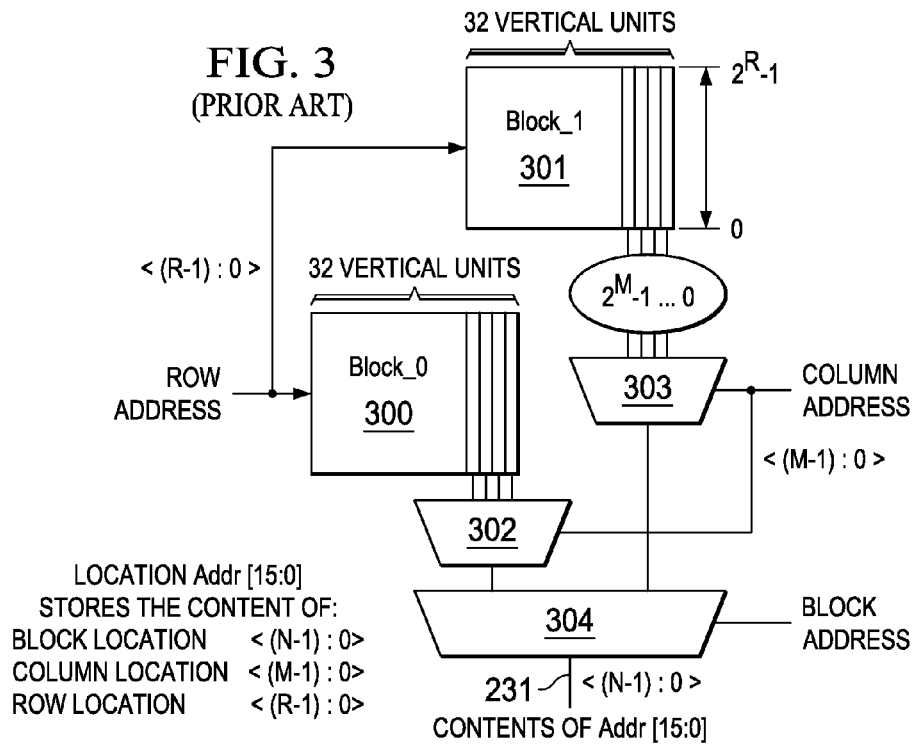
FIG. 3 is a diagram illustrating a prior art example two-block memory addressed by three address components: column address; row address; and block address.

FIG. 3 illustrates memory read portion of a prior art device included here as an example of how address scrambling may be used. In the example FIG. 3, the memory has N blocks, each block has M columns and each column has R rows. Output data from two memory blocks (block_0 300 and block_1 301 are selected by multiplexers 302, 303 and 304. Each of the thirty-two vertical units of block_0 300 and block_1 301 contain thirty-two rows of data, each row containing four eight-bit bytes labeled bytes 0 through 3.

Row address <R−1:0> supplies the row address input of block_0 300 and block_1 301 and selects one row out of rows $2^R-1$ to 0 in each block. Data from column $2^M-1$ to column 0 are output from block_0 300 to multiplexer 302. Column address <M−1:0> supplied to the control input of multiplexer 302 selects the data for the corresponding column. Similarly, data from column $2^M-1$ to column 0 are output from block_1 301 to multiplexer 303. Column address <M−1:0> supplied to the control input of multiplexer 303 selects the data for the corresponding column. The outputs of multiplexers 302 and 303 are supplied as inputs to multiplexer 304. Block address <N−1:0> supplied to the control input of multiplexer 304 selects data from the corresponding block for output as data 231.

In the memory of FIG. 3: a column address <(M−1):0> bits wide selects between M columns; a block address <(N−1):0> bits wide selects between N blocks of memory banks; and a row address <(R−1):0> bits wide selects between R rows of logical addresses inside each bank of memory.

FIG. 3 illustrates a partitioning of the example memory blocks. The example memory of FIG. 3 requires that the SRAM addresses have two-bit column addresses <0> and <1>, two-bit row A addresses <2> and <3>, a single-bit block address <4> and a three-bit row B address <5>, <6> and <7>. The address supplied to the memory is divided into these three sections. The positions of the above regions may vary from design to design.

The prior pBIST 130 illustrated in FIGS. 1 and 2 is designed for straightforward linear addressing. Row addresses are the address least significant bits (LSBs) <0> through <4>. Column addresses are bits <5> and <6>. The block address is bit <7>. Incrementing through these addresses would fetch data from row 0 through row 31 in sequential order in block_0 300 and then data from row 32 through 63 in sequential order in block_1 301.

The first pass of this linear addressing would address block_0 300 and proceed through all row addresses sequentially fetching all column 0 data first, and all column 1 data next, followed by column 2 data and finally column 3 data. The second pass of this linear addressing would address block_1 301 and proceed through all row addresses sequentially fetching all column 0 data first, and all column 1 data next, followed by column 2 data and finally column 3 data.

Figure 4:
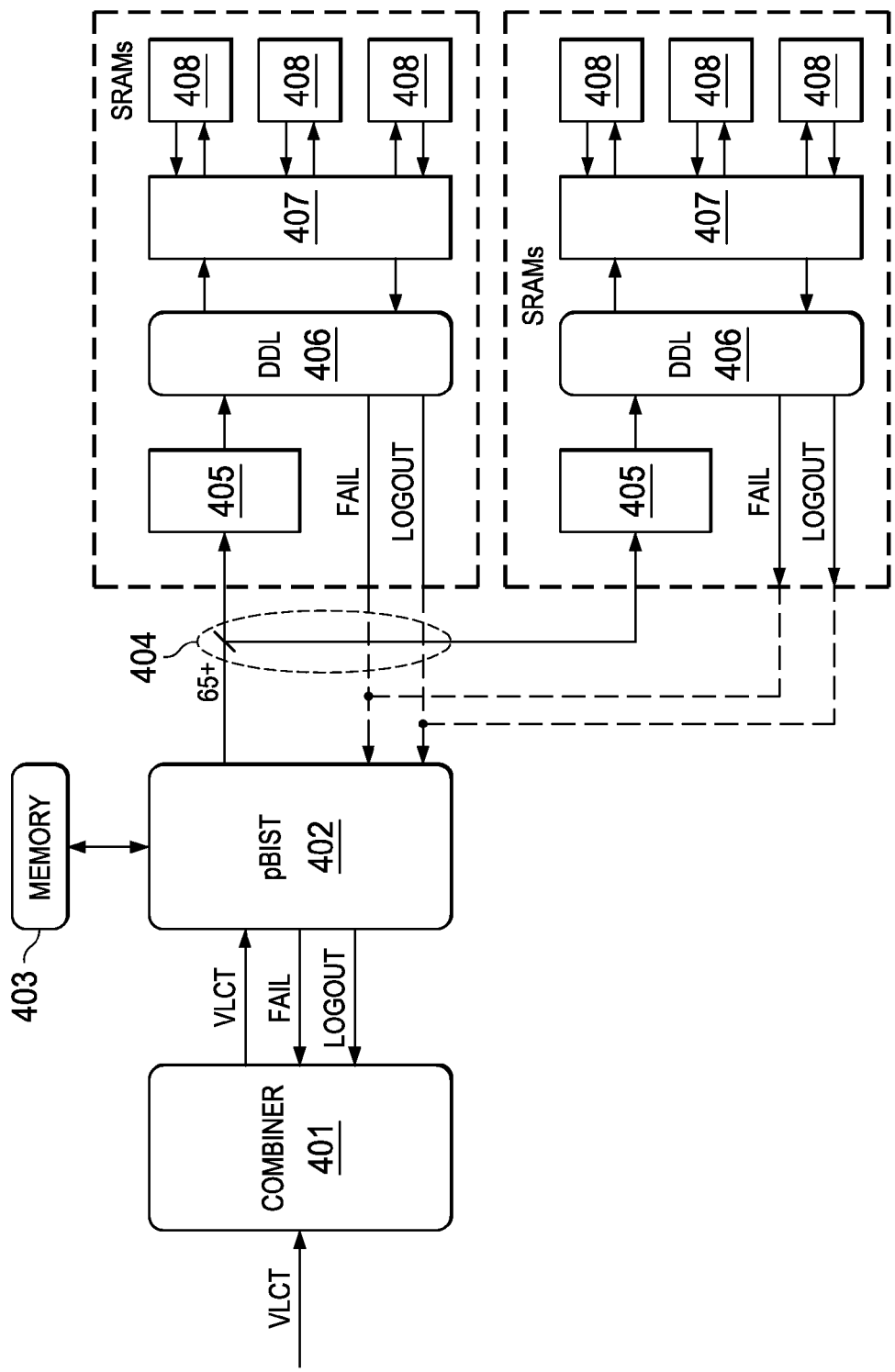
FIG. 4 shows the pBIST architecture with Distributed Data Logging.

The prior art shown in FIGS. 1-3 employs an architecture where the pBIST and the data logger are integrated. The architecture demonstrated in FIG. 4 consists of a single pBIST, with a Distributed Data Logger system. Each sub chip incorporates a data logger that communicates with the controlling pBIST.

Data is input from the tester (VLCT) to combiner 401 to format the data, then to pBIST block 402, with pBIST memory 403. pBIST 402 communicates with the applicable sub chips via the compressed data bus, and receives fail and log information from each sub chip. The log information is presented in a serial manner to reduce the number of connections.

The sub chips may contain an asynchronous bridge 405 if they operate in a different voltage and/or clock domain from the pBIST. Asynchronous bridge 405 connects to distributed data logger 406 which communicates to control block 407. Block 407 expands the compressed data before writing the test pattern to memory 408, and then reads the result from 408. The comparison of the expected and actual memory data is performed in DDL 406. Since the comparison is done locally in each sub chip, there is no need to return the read data to the pBIST thus reducing the number of connections.

Figure 5:
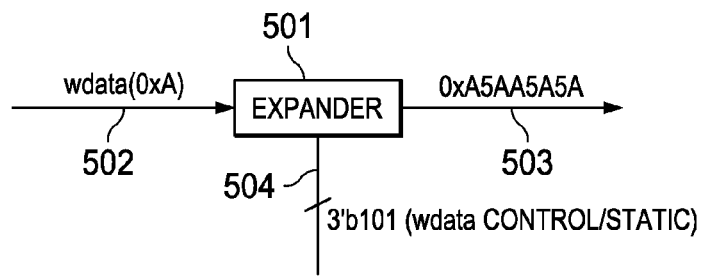
FIG. 5 shows an example of the data compression.

FIG. 5 shows an example of the expander operation. Expander 501 receives 4 bit data 502 and configuration data 504, generating 32 bit output 503. the expansion is done as follows:

wdata[7:4]=~(wdata[3:0]) when (ctl[0]=1)

else wdata[3:0]

wdata[15:8]=~(wdata[7:0]) when (ctl[1]=1)

else wdata[7:0]

wdata[31:16]=~(wdata[=15:0]) when (ctl[2]=1)

else wdata[15:0]

Figure 6:
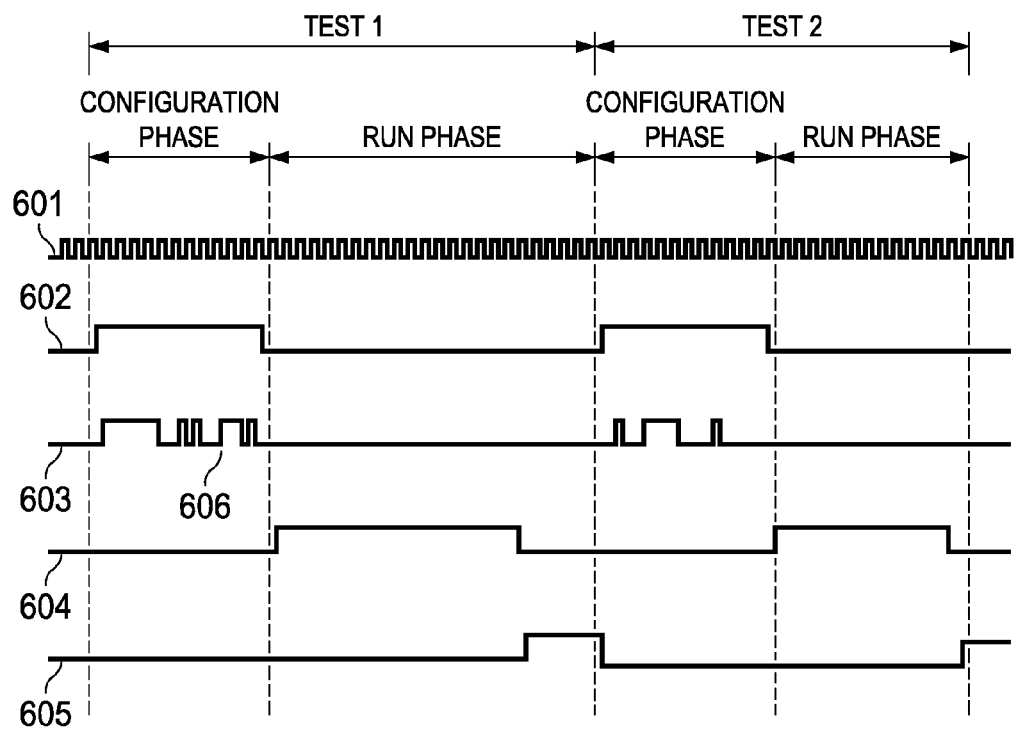
FIG. 6 shows the serial bus timing diagram.

The timing diagram of the serial data bus is shown on FIG. 6 where 601 is the pBIST clock, 602 control scan enable, 603 is the scan data, 604 pBIST run signal and 605 is the pBIST done signal. 606 shows the scanned data. the following control signals are communicated through the serial interface:

CSR, RGS, WCTL expander control signals
PLAT pipeline latency
MISR, CMISR, DW data width

What is claimed is:

1. An embedded memory test system comprising of:
   a programmable Built In Self Test (pBIST) engine, said pBIST engine generating a 4 bit data word wdata[3:0] and a 3 bit control signal ctl[2:0];
   a plurality of distributed data logging circuits communicating with the pBIST engine;
   a plurality of bus expanders, each of said bus expanders connected to a corresponding distributed data logger, each of said bus expanders connected to said pBIST engine to receive said 4 bits of data and said 3 bit control signal, each of said bus expanders expanding said 4 bit data word wdata[3:0] into a 32 bit expanded data word wdata[31:0] as follows
      if ctl[0] is 1, then expanded bits 4 to 7 are the inverse of w[3:0] else if ctl[0] is 0, then expanded bits 4 to 7 equal w[3:0] forming wdata[7:0],
      if ctl[1] is 1, then expanded bits 8 to 15 are the inverse of w[7:0] else if ctl[1] is 0, then expanded bits 8 to 15 equal w[7:0] forming wdata[15:0], and
      if ctl[2] is 1, then expanded bits 16 to 31 are the inverse of w[15:0] else if ctl[2] is 0, then expanded bits 16 to 31 equal w[15:0] forming wdata[31:0]; and
   one or more memory blocks operable with each distributed data logger.

2. The embedded memory test system of claim 1 wherein:
   the distributed data logging circuits receive configuration data from the pBIST through a serial data interface.

3. The embedded memory test system of claim 1 wherein:
   the said bus expanders are configured by a serial data interface.

4. The embedded memory test system of claim 1 wherein:
   each of said distributed data loggers are further operable to write 32 bit expanded data word wdata [31:0] into selected locations in a corresponding memory block;
   read data present in said corresponding memory block from memory locations said 32 bit expanded data word wdata [31:0] was written into;
   compare the data read from the memory block to an expected memory content;
   generate an error condition if the data read from the memory block do not match the expected memory content;
   communicate the error condition to the pBIST through a serial link.

* * * * *